United States Patent
Aiyar et al.

(10) Patent No.: US 9,236,160 B2
(45) Date of Patent: Jan. 12, 2016

(54) POLYMER FILM-PRODUCING METHODS AND DEVICES PRODUCED THEREFROM

(71) Applicant: Georgia Tech Research Corporation, Atlanta, GA (US)

(72) Inventors: Avishek Aiyar, Atlanta, GA (US); Rakesh Nambiar, Wilmington, DE (US); David M. Collard, Atlanta, GA (US); Elsa Reichmanis, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 13/962,608

(22) Filed: Aug. 8, 2013

(65) Prior Publication Data

US 2014/0046012 A1 Feb. 13, 2014

Related U.S. Application Data

(62) Division of application No. 13/077,896, filed on Mar. 31, 2011, now Pat. No. 8,603,705.

(60) Provisional application No. 61/319,469, filed on Mar. 31, 2010.

(51) Int. Cl.
| | |
|---|---|
| *H01B 1/12* | (2006.01) |
| *C08J 5/22* | (2006.01) |
| *C08G 61/12* | (2006.01) |
| *G03H 3/00* | (2006.01) |
| *C08J 3/28* | (2006.01) |
| *H01L 51/00* | (2006.01) |

(52) U.S. Cl.
CPC .............. *H01B 1/127* (2013.01); *C08G 61/126* (2013.01); *C08J 5/2256* (2013.01); *C08G 2261/3223* (2013.01); *C08J 2353/02* (2013.01); *H01L 51/007* (2013.01); *H01L 51/0037* (2013.01)

(58) Field of Classification Search
CPC ...................................................... H01B 1/12
USPC ................ 526/256; 430/3; 528/380, 383, 480
See application file for complete search history.

(56) References Cited

U.S. PATENT DOCUMENTS

| | | | |
|---|---|---|---|
| 6,890,868 B2 | 5/2005 | Wu et al. | |
| 7,517,719 B2 | 4/2009 | Kugler et al. | |

(Continued)

FOREIGN PATENT DOCUMENTS

| | | |
|---|---|---|
| JP | 2005268582 | 9/2005 |
| WO | 2009105041 | 8/2009 |
| WO | 2009133984 | 11/2009 |

OTHER PUBLICATIONS

Kim, Bong-Gi et al., "Ultrasonic-Assisted Nanodimensional Self-Assembly of Poly-3-Hexylthiophene for Organic Photovoltaic Cells", American Chemical Society, vol. 4, No. 4, 2010, pp. 2160-2166.

(Continued)

*Primary Examiner* — Duc Truong
(74) *Attorney, Agent, or Firm* — Troutman Sanders LLP; Ryan A. Schneider; Troy S. Kleckley

(57) ABSTRACT

Described herein are improved methods of forming polymer films, the polymer films formed thereby, and electronic devices formed form the polymer films. The methods generally include contacting a polymer with a solvent to at least partially solvate the polymer in the solvent, exposing the at least partially solvated polymer and solvent to ultrasonic energy for a duration effective to form a plurality of ordered assemblies of the polymer in the solvent, and forming a solid film of the polymer, wherein the solid film comprises the plurality of ordered assemblies of the polymer.

20 Claims, 5 Drawing Sheets

(56) References Cited

U.S. PATENT DOCUMENTS

| | | |
|---|---|---|
| 2006/0060839 A1 | 3/2006 | Chandross et al. |
| 2006/0237695 A1 | 10/2006 | Williams et al. |
| 2007/0275498 A1 | 11/2007 | Beecher et al. |
| 2012/0088901 A1 | 4/2012 | Aiyar et al. |

OTHER PUBLICATIONS

Zhao, Kui et al., "A New Method to Improve Poly (3-hexyl thiophene) (P3HT) Crystalline Behavior: Decreasing Chains Entanglement to Promote Order-Disorder Transformation in Solution", Langmuir Article, American Chemical Society, vol. 26, No. 1, 2010, pp. 471-477.

POLYMER FILM-PRODUCING METHODS AND DEVICES PRODUCED THEREFROM

CROSS-REFERENCE TO RELATED APPLICATION

This application is a divisional application of U.S. patent application Ser. No. 13/077,896, filed 31 Mar. 2011 now U.S. Pat. No. 8,603,705, which claims the benefit of U.S. Provisional Patent Application No. 61/319,469, filed 31 Mar. 2010, both of which are incorporated herein by reference in their entirety as if fully set forth below.

STATEMENT OF FEDERALLY SPONSORED RESEARCH

This invention was made with Government support under Grant No. DMR-0120967 awarded by the National Science Foundation. The Government has certain rights in this invention.

TECHNICAL FIELD

The various embodiments of the present invention relate generally to methods of producing polymer films that have improved properties and, more particularly, to methods of making improved polymer films using ultrasound to increase crystallinity.

BACKGROUND

There are a number of advantages to replacing traditional (i.e., inorganic-based) electronic devices with those formed form organic materials (e.g., electroactive or conjugated polymers). For example, organic materials are generally lighter, more flexible, and cheaper to fabricate than inorganic materials. These materials and the devices produced therefrom, however, are not immune to the fabrication and/or integration challenges that exist for traditional electronics, especially with the ever-increasing demands of consumers for improved devices.

One such remaining challenge involves controlling the microstructure of organic materials in the solid state. Given the importance of microstructure on the intermolecular charge transport properties of films of conjugated polymers, the ability to control the microstructure of such materials should lead to improved conductivities or at least to similar conductivities with fewer charge carriers.

A common method for increasing the charge transport, or carrier mobility, in a polymer film entails thermally annealing the polymer at a high temperature, which is typically close to the glass transition temperature of the polymer, followed by a slow crystallization. This, however, requires the process to be conducted under extremely low oxygen and moisture concentrations so as to ensure that the polymer does not oxidize. Dielectric surface modifications using self-assembled monolayers provide another technique for mobility enhancement. Controlled deposition of monolayers, however, is often difficult to achieve and also requires moisture free environments. Other techniques include the use of high boiling point solvents, different deposition techniques, and the generation of ordered precursors in solution by using non-solvent aggregation. Unfortunately, the increases in mobility that are achieved by each of the above-referenced techniques are not significant. High mobility can be achieved by using high purity polymers with high regioregularity (e.g., greater than 98%), which can be process intensive to synthesize.

Thus, despite the advancements made in controlling the microstructure (and, by extension, the mobility) of organic materials in the solid state, there remains a need for improved methods for doing so. Such methods can lead to improved devices that exhibit higher mobilities and potentially higher conductivities. It is to the provision of such methods and devices that the various embodiments of the present inventions are directed.

BRIEF SUMMARY

The various embodiments of the present invention provide new and facile approaches to enhance the crystallinity of solution-processed polymer films. Such processes present significant advantages over existing techniques for improving crystallinity, and result in improved films and devices.

According to some embodiments of the present invention, a method includes contacting a polymer with a solvent to at least partially solvate the polymer in the solvent. The method can also include exposing the at least partially solvated polymer and solvent to ultrasonic energy for a duration effective to form a plurality of ordered assemblies of the polymer in the solvent. The method can also include forming a solid film of the polymer, wherein the solid film comprises the plurality of ordered assemblies of the polymer. In some implementations, the method also involves forming an electronic device from the solid film of the polymer.

The polymer can be chosen from a variety of polymers. For example, the polymer can be a conjugated polymer. The conjugated polymer can be a rigid-rod conjugated polymer. In some cases, the polymer can be a polythiophene or derivative thereof. For example, the polymer can be poly(3-hexylthiophene). In some situations, a weight average molecular weight of the polymer will be at least about 10 kiloDaltons. In other situations, a weight average molecular weight of the polymer will be at least about 15 kiloDaltons.

The solvent will, in some embodiments, completely solvate the polymer during the contacting step. In some other cases, the solvent will not allow solute-solute interactions to dominate over solvent-solute interactions.

The duration of the exposing step can be less than or equal to about 15 minutes. During the exposing step, the ultrasonic energy can cause individual chains of the polymer to disentangle from each other, and aggregate to form the plurality of ordered assemblies. In certain situations, each of the plurality of ordered assemblies will be at least nanocrystalline in size.

The solid film of the polymer is capable of exhibiting a carrier mobility of at least one order of magnitude greater than a solid film formed without the exposing step.

According to some embodiments, a polymer film can be formed. According to other embodiments, an electronic device can be formed.

Still according to other embodiments, another method includes contacting poly(3-hexylthiophene) with a solvent to at least partially solvate the poly(3-hexylthiophene) in the solvent. In this method, the poly(3-hexylthiophene) has a weight average molecular weight of at least 15 kiloDaltons and a regioregularity of at least 92%. This method can also include exposing the at least partially solvated poly(3-hexylthiophene) and solvent to ultrasonic energy for a duration effective to form a plurality of ordered assemblies of the poly(3-hexylthiophene) in the solvent. In addition, the method can involve forming a solid film of the poly(3-hexylthiophene), wherein the solid film comprises the plurality of ordered assemblies of the poly(3-hexylthiophene) and wherein the solid film comprises a carrier mobility of at least one order of magnitude greater than a solid film of poly(3- hexylthiophene) formed without the exposing. In still other cases, the method can further include forming an electronic device from the solid film of the polymer.

Using this method, the solvent can be one or more of chloroform, thiophene, chlorobenzene, dichlorobenzene, trichlorobenzene, or toluene.

Using this method, the plurality of ordered assemblies can be at least nanocrystalline in size.

According to some embodiments, a poly(3-hexylthiophene) film can be formed. According to other embodiments, an electronic device can be formed.

Other aspects and features of embodiments of the present invention will become apparent to those of ordinary skill in the art, upon reviewing the following detailed description in conjunction with the accompanying figures.

DETAILED DESCRIPTION

Figure 1:
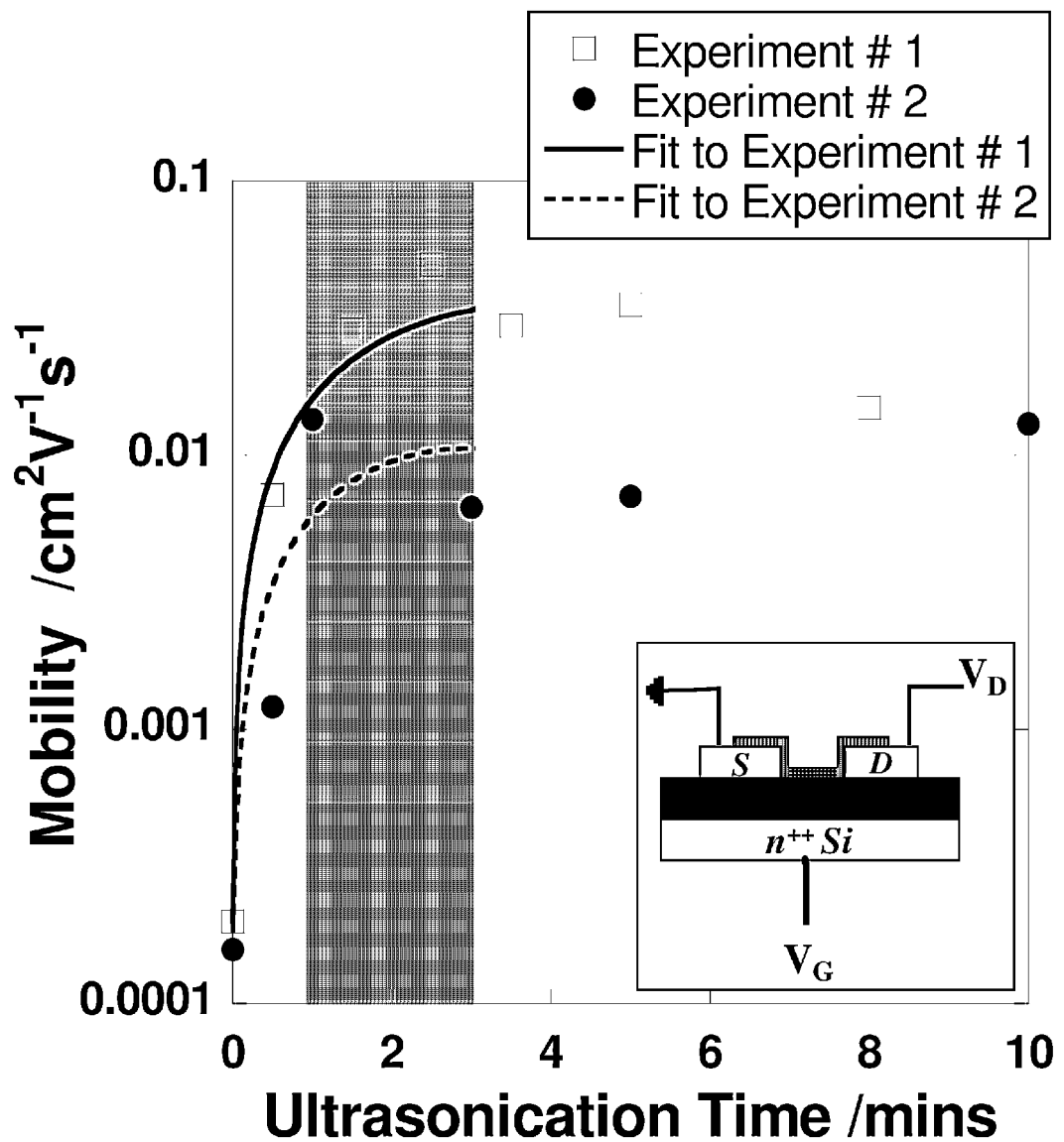
FIG. 1 graphically illustrates the evolution of field effect mobility as a function of ultrasonication time. The field effect mobilities were calculated in the linear region of transistor operation using a drift velocity of −3 volts. The inset shows the organic field effect transistor geometry used for testing. The fits are shown to provide a visual guideline to highlight the saturation of the field effect mobility.

Referring now to the figures, wherein like reference numerals represent like parts throughout the several views, exemplary embodiments of the present invention will be described in detail. Throughout this description, various components may be identified having specific values or parameters, however, these items are provided as exemplary embodiments. Indeed, the exemplary embodiments do not limit the various aspects and concepts of the present invention as many comparable parameters, sizes, ranges, and/or values may be implemented. The terms "first," "second," and the like, "primary," "secondary," and the like, do not denote any order, quantity, or importance, but rather are used to distinguish one element from another. Further, the terms "a," "an," and "the" do not denote a limitation of quantity, but rather denote the presence of "at least one" of the referenced item.

As stated above, the various embodiments of the present invention are directed to improved methods for producing polymer films, as well as the improved films and electronic devices made therefrom. In contrast to the prior art, the methods described herein implement ultrasonic energy to promote increased molecular ordering of a polymer material in solution. It has unexpectedly been found that, rather than serving to disperse and/or degrade the polymer within the solvent as the use of ultrasound is apt to do, the use of ultrasound in the present invention facilitates the assembly or aggregation of polymer chains into ordered structures.

The methods of the present invention generally entail contacting a polymer with a solvent to at least partially solubilize the polymer therein. This solution (i.e., the at least partially solvated polymer solute in the solvent) is then exposed to ultrasound for a time effective to aggregate the polymer chains in solution such that a plurality of ordered assemblies is formed. Subsequently, the sonicated solution can be used to form a film of the polymer on a given substrate. Finally, the polymer film can be incorporated into an organic-based electronic device.

The methods described herein can be implemented with a variety of polymers. For example, certain linear chain polymers, branched chain polymers, aromatic polymers, branched aromatic polymers, proteins, and the like can be used. To produce an electronic device with improved properties, however, the polymers generally should be conjugated polymers. In exemplary embodiments, the conjugated polymer can be a so-called "rigid-rod" conjugated polymer. In these cases, the rigidity of the conjugated polymer will ensure better pi-stacking or pi-pi interactions between the different polymer chains. Exemplary rigid-rod polymers include polythiophenes, polyphenylenes, polyfluorenes, and the like, and derivatives thereof.

The methods described herein are particularly suitable for polymers having high molecular weights. This includes polymers having a weight average molecular weight of greater than or equal to about 15 kiloDaltons (kDa). In some cases, polymers having a weight average molecular weight of greater than or equal to about 40 kDa are preferred. It is important to note that the molecular weight of the polymer should be low enough such that the polymer can be at least partially solvated by the particular solvent chosen. Those skilled in the art to which this disclosure pertains will readily understand how to determine the upper limit for a given polymer's molecular weight.

Turning now to the solvent, a few considerations must be made in selecting an appropriate or good solvent. So-called "good" solvents should be capable of completely solvating the individual polymer chains so as to minimize or eliminate interchain interactions that cause polymer aggregation. From a solution thermodynamics standpoint, a good solvent has a solubility parameter that is close to or substantially close to that of the polymer.

In contrast, an inappropriate or bad solvent is one that does not adhere to the above criteria for good solvents. When a so-called "bad" solvent is used, one of two possibilities can occur in an extreme case. Specifically, either the individual polymer chains collapse onto themselves, thereby adopting a spherical shape, or the solute-solute interactions dominate over solute-solvent interactions so as to induce interchain aggregation. These phenomena typically are absent in a good solvent.

It should be noted that, for a given polymer, the appropriateness of a solvent will depend on the polymer properties themselves (e.g., molecular weight, regioregularity, and the like). For example, a decrease in molecular weight and/or regioregularity for a given polymer generally results in increased solubility of that polymer in the solvent. In contrast, an increase in the molecular weight and/or regioregularity for the same polymer can lead to a decrease in solubility in the same solvent. This necessitates the inclusion of a third category of solvents, namely, the so-called "marginal" solvents.

This type of solvent induces a non-linear relationship in solubility. That is, a subtle change in the molecular weight and/or regioregularity of a given polymer in such a solvent will result in a drastic change in the solubility of the polymer therein. For the purposes of the embodiments of the present invention, the methods described herein are capable of implementing both "good" and "marginal" solvents. Those skilled in the art to which this disclosure pertains will be able to distinguish between a good, marginal, and bad solvent for a given polymer without undue experimentation.

By way of illustration, an example of solvent categorization will now be provided for an exemplary polythiophene. Good solvents for poly(3-hexylthiophene) (P3HT) include chloroform, thiophene, chlorobenzene, dichlorobenzene, and trichlorobenzene to name a few. Similarly, a couple of marginal solvents for P3HT include toluene and p-xylene. Finally, a few poor solvents for P3HT include hexane, methanol, acetonitrile, and benzylchloride. It is to be understood that there can be many other good, marginal, and bad solvents for P3HT, wherein the good and marginal solvents are contemplated by the methods of the present invention. Those listed above are simply for illustration only, and are not intended to be limiting.

Once the appropriate solvent is chosen for the selected polymer, the polymer is disposed in the solvent. This step should result in at least partial solvation of the polymer in the solvent. This step can occur at different temperatures and pressures, and in different environments (e.g., inert, ambient, air-free, and the like). Additionally, this step can be facilitated by stirring or other agitation of the medium in which the solvent is contained.

Once the at least partially solvated polymer solution has been formed, it can be exposed to ultrasonic energy. The source of the ultrasound can be an ultrasonic probe, an ultrasonic bath, or other like apparatus. The at least partially solvated polymer solution can be exposed to ultrasound for a time effective to cause the ordered assemblies of polymer chains to form. In general, this duration is less than about 15 minutes, but can be longer if necessary. In many cases, the duration of sonication will be less than about 5 minutes.

Without intending to be limited to any particular theory, it is believed that portions (i.e., certain moieties or pendant groups, or even the backbones themselves) of the polymer chains can become entangled when placed in the solvent, and the ultrasound, rather than dispersing the polymer chains or breaking bonds within the chains, causes the chains to become disentangled. It is also believed that the disentangled chains then aggregate in a manner so as to form ordered assemblies. Depending on the size of the assemblies, they can be nanocrystalline or even microcrystalline in nature.

Once the ordered assemblies of polymer chains have been formed by means of sonication, the sonicated solution can be used to form a film of the polymer on a substrate. There is no particular limitation on the technique used to form the polymer film. For example, the film can be formed by spin coating, drop coating, dip coating, spray coating, and the like. Those skilled in the art to which this disclosure pertains can readily select the film-forming technique.

Further, there is no particular limitation on the composition of the substrate. That is, any substrate material can be used. When choosing a substrate material, however, consideration should be given to the ultimate application and/or properties desired for the polymer film. For example, if an application calls for flexibility, then a flexible substrate, such as polyethylene terephthalate (PET) or polydimethylsiloxane (PDMS), can be used. Similarly, if an application requires the polymer to be electrically insulated from other components, then the substrate can be chosen from an insulating material. Those skilled in the art to which this disclosure pertains can readily select the substrate on which the polymer film is formed.

As a result of the ordered assemblies of polymer chains having been formed during the sonication step, the resultant polymer films can have greater crystallinity than films formed without the sonication step. In some cases, the ordering will result in improved pi-pi stacking of polymer chains such that the carrier mobility of the polymer film will be significantly improved. In certain instances, improvements in mobility of two orders of magnitude or more can be attained. The improved mobilities in such films can result in concomitant increases in electrical conductivity.

Once the film of the polymer is formed, it can be implemented in an electronic device. In general, any device that implements a semiconducting material can be formed using the polymer films formed by the methods of the present invention. Specific electronic devices that can be formed include organic transistors, organic dielectrics, organic conductors, organic field effect transistors (OFETs), organic photovoltaics (OPVs), organic light emitting diodes (OLEDs), and the like. Those skilled in the art to which this disclosure pertains will readily be able to use the polymer films in an electronic device.

It should be noted that the methods described herein can allow for solution-phase control of the solid state properties of polymer films, which could result in elimination of the need for dielectric surface modifications or additional processing steps such as thermal annealing of the thin films themselves.

The various embodiments of the present invention are further illustrated by the following non-limiting example.

EXAMPLES

Example 1

Fabrication and Characterization of Regioregular Poly(3-hexylthiophene) Thin Films In this example, a strong correlation between the degree of crystallinity and the corresponding charge transport properties of films of high molecular weight (MW=ca. 48 kDa) regioregular (92-94%) poly(3-hexylthiophene) (P3HT) was observed by systematically varying the films' microstructures using ultrasonic irradiation of the polymer solution. A percolation-type mechanism is proposed for charge transport in these materials that are obtained under kinetically limiting, rapid film-forming conditions. The spectroscopic evidence supported the ultrasound-induced formation of microcrystallites in solution which were otherwise absent in pristine, non-irradiated solutions. Without intending to be bound by theory, it is believed that the ultrasonication facilitated the assembly of the high MW polymer chains which do not have an inherent tendency to organize into ordered structures either in solution or under rapid film-forming conditions. The ultrasound-induced crystallinity evolved as a function of irradiation time and led to an initial sharp increase in the field effect mobility by two orders of magnitude, and eventually saturated at about $10^{-2}$ $cm^2V^{-1}s^{-1}$. The behavior suggested percolation type conductivity. This ultrasonication of polymer solutions prior to film fabrication represents a facile approach to achieving high mobility P3HT organic field effect transistors (OFETs), but also allows for elucidation of the important role of the degree of thin film crystallinity in controlling charge transport. Moreover, keeping the properties of the polymer (molecular weight and regioregularity) and the solvent fixed, this example leads to an independent analysis of the effects of microcrystallinity.

The materials used in this example will now be discussed. The P3HT was purchased from Sigma Aldrich and used without further purification. This material had a number average molecular weight (Mn) of about 24 kD and weight average molecular weight (Mw) of about 47.7 kD (from GPC in tetrahydrofuran calibrated with polystyrene standards using a Waters 1515 Isocratic HPLC system with a Waters 2489 UV/Vis detector, using a Styragel HR 5E column) and a head to tail regioregularity of about 92-94% (as estimated from the $^1$H NMR spectra which were recorded using Bruker DSX 300 in deuterated chloroform at 293 K).

The OFET fabrication and characterization will now be discussed. The FET devices used for electrical characterization consisted of two contact devices where P3HT films were spin coated onto a roughly 200 nanometer (nm) thick $SiO_2$ gate dielectric. The highly-doped silicon wafer served as the gate electrode while Au/Cr was used for the source and drain contacts. The source and drain contacts were fabricated using a standard photolithography-based lift-off process, followed by E-beam evaporation of about 40 nm Au contacts with about 3 nm of Cr as the adhesion layer. Before spin coating P3HT solutions, all of the devices were cleaned in piranha solution (i.e., 4 parts sulfuric acid to 1 part hydrogen peroxide) to ensure complete removal of any residual photoresist and other organic contaminants, followed by cleaning with acetone, isopropanol, and deionized water in an ultrasound cleaning bath. At the end of the cleaning process, the substrates were hydrophilic. The substrates were then dried on a contact hot plate at about 150° C. for about 30 minutes. The solutions used for making field effect transistors were prepared in air by dissolving the P3HT in $CHCl_3$ (about 4 mg/mL) at about 50° C. with stirring. A table top ultrasonic cleaner (Bransonic 2510, 40 kHz, 130 W) was used for ultrasonic irradiation of the solutions.

OFETs were prepared by spin coating the solutions onto the pre-cleaned substrates and tested in air without any further treatment using an Agilent 4155C semiconductor parameter analyzer. The field effect mobility was calculated in the linear region of transistor operation (VD=−3 V) by plotting the drain current (ID) versus the gate voltage (VG) and fitting the data to the following equation:

$$I_D = \mu C_{ox} \frac{W}{L}(V_G - V_T)V_D$$

where $V_T$ is the threshold voltage, W and L are the transistor channel width and length, respectively, and $C_{ox}$ is the capacitance per unit area of the silicon dioxide gate dielectric=1.72× $10^{-8}$ F/cm$^2$. Caution must be exercised when studying the role of irradiation time, since there are variations in ultrasound intensity across the ultrasound bath and therefore between experiments. Although irradiation intensity is a more appropriate index, time is used here in the absence of quantification of the ultrasound intensity. Thus, a single batch of the solution was sequentially irradiated to obtain consistent results within a single set of experiments. The experimental data was fit to a quadratic function. The fit is only shown for the first 4 minutes of ultrasonic irradiation to highlight the saturation behavior of the mobility data. While only an approximate fit, this does provide a visual guideline to depict the trend in the mobility as a function of time which is reproducible.

The solution and solid state UV-Vis spectra of P3HT were obtained using an Agilent 8510 Spectrophotometer. Films for solid state studies were spin coated onto pre-cleaned glass slides.

The grazing incidence X-ray diffraction studies will now be discussed. Out-of-plane grazing incidence X-ray diffraction data were obtained using a Panalytical X'Pert Pro system equipped with a Cu X-ray source operating at about 45 kV and about 40 mA. Grazing incidence angle was fixed at about 1° and the detector was scanned from about 3° to about 20°. Peak positions were obtained from the measured profiles by fitting the peaks using XRD analysis software (MDI JADE). Samples for GIXD measurements were prepared by spin coating P3HT/$CHCl_3$ solutions (with and without ultrasonic irradiation) on hydrophilic silicon substrates with native oxide that were cleaned using the same procedure used for bottom contact FET substrates. These were the same solutions as used for the OFET measurements.

The atomic force microscopy (AFM) studies of P3HT will now be described. The AFM measurements were performed on films spin coated on bare silicon dioxide substrates prepared under the same conditions as the bottom contact substrates for OFET measurements, with a Veeco Digital Instruments Dimension 3100 scanning probe microscope in tapping mode with a silicon tip. While a different set of solutions was used to prepare samples for AFM, the ultrasonication conditions were the same as those used in OFET preparation. The original UV-Vis spectra were used as references to achieve similar results.

The field effect mobility measurements will now be discussed. Bottom-contact field effect transistors were fabricated by spin coating films of P3HT from about 4 milligrams per milliliter (mg/mL) chloroform ($CHCl_3$) solution in order to characterize the charge transport properties of films formed from solutions irradiated for various times. FIG. 1 shows the increase in the mobility of the films with ultrasonic irradiation time for two sets of experiments (the time scale for the sharp increase in mobility varied between the two sets of data, for reasons noted above). In both cases, the trend was characterized by an initial sharp increase in mobility by two orders of magnitude after short irradiation times (about $2\times10^{-4}$ cm$^2$V$^{-1}$s$^{-1}$ to about $2.9\times10^{-2}$ cm$^2$V$^{-1}$s$^{-1}$ after about 1.5 minutes irradiation for "experiment 1" and about $1.6\times10^{-4}$ cm$^2$V$^{-1}$s$^{-1}$ to about $1.4\times10^{-2}$ cm$^2$V$^{-1}$s$^{-1}$ after about 1 minute of irradiation for "experiment 2"). This was followed by an apparent saturation of the mobility within about 1 to about 3 minutes of ultrasonic irradiation for both experiments, as shown by the shaded region in FIG. 1, with slight fluctuations about the average saturated value (about 0.03 cm$^2$V$^{-1}$s$^{-1}$ and about 0.01 cm$^2$V$^{-1}$s$^{-1}$ for experiments 1 and 2, respectively). In both experiments, an order of magnitude increase in the mobility was observed for an ultrasonication time of as little as about 30 seconds. Such a behavior of the field effect mobility as a function of ultrasonic irradiation time was strong evidence of a percolation type transport mechanism, which is commonly observed in composite materials consisting of carbon nanotubes or carbon black as conductive fillers in insulating polymer matrices. Such systems are characterized by a sharp increase in the conductivity at a certain critical filler content, known as the percolation threshold, beyond which there is little or no further change in conductivity on further addition of the conductive filler. Vapor deposited organic thin film transistors also exhibit a sharp increase in charge transport characteristics once a geometric percolation between individual islands formed during film growth is established. The observation of a similar electrical behavior in the spin coated P3HT films of this example, for which the film formation mechanism was significantly different from that involved in vapor deposition, suggested that the percolation behavior might also be due to the presence of multiple phases or regions, each with different charge transport characteristics, and not simply due to a geometric percolation leading to channel formation. Interestingly, the molecular weight dependence of the mobility was also characterized by an initial increase followed by an eventual saturation of the mobility value, suggesting that similar mechanisms may be at play in mediating charge transport in the P3HT thin films. The similarities in the mobility profiles upon ultrasonication (this example) and the modification of molecular weight supports an ultrasound induced structural change in the spin coated polymer films, which have been explored using a number of techniques, as described below.

Figure 2A:
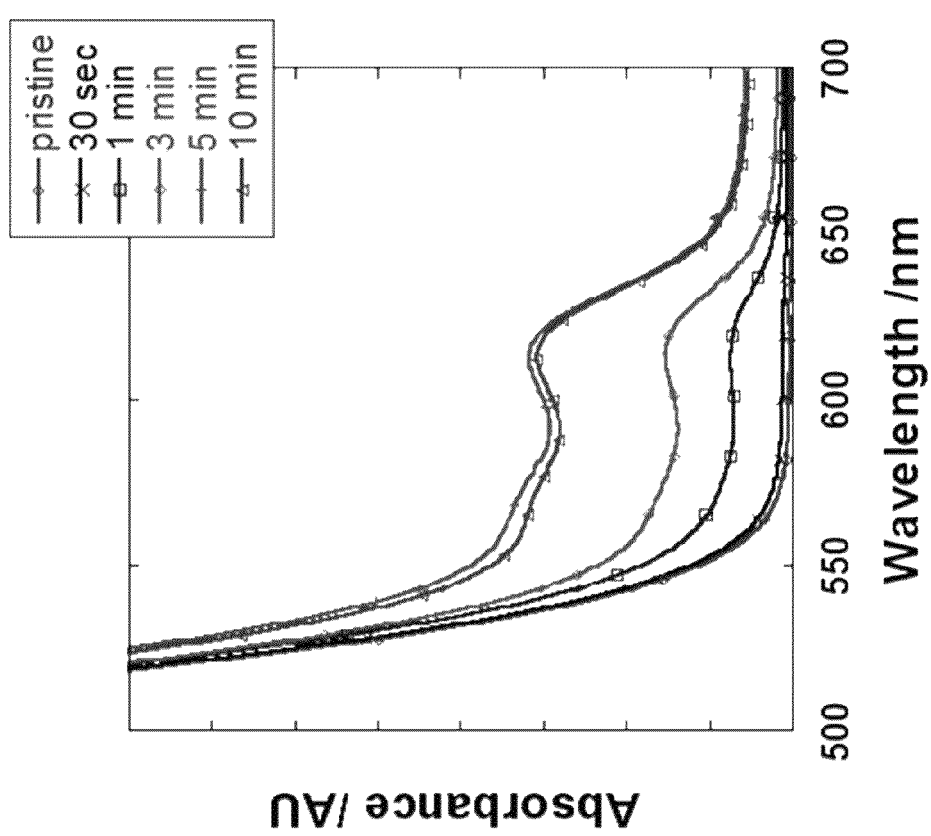
FIG. 2 graphically illustrates normalized (a) solution and (b) solid state UV-Vis spectra for poly(3-hexylthiophene)/chloroform solutions spin coated on pre-cleaned glass slides as a function of solution ultrasonication time.
Figure 2B:
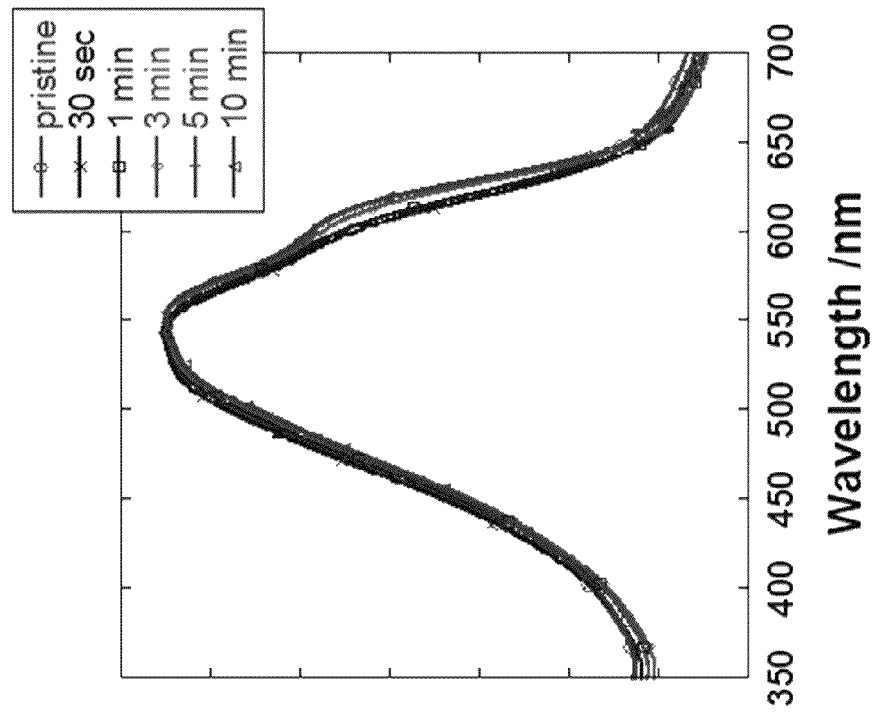

The visible and UV spectroscopy data will now be discussed. FIG. 2 shows the electronic absorption spectra of $CHCl_3$ solutions of P3HT that have been irradiated with ultrasound (FIG. 2(a)) and of the corresponding films obtained by spin coating the solutions onto glass slides (FIG. 2(b)). The solution state absorption maximum, $\lambda max$, associated with the $\pi$-$\pi$* intraband transition appears at about 450 nm for all solutions, irrespective of the ultrasonic irradiation time and consistent with previous investigations of regioregular head-to-tail P3HT. However, two additional peaks appear at lower energies with increasing irradiation time, suggestive of a vibronic structure with a 0-0 transition at about 610 nm and a vibronic side band at about 570 nm respectively. The appearance of these peaks was accompanied by a concomitant change in the color of the solution from bright orange to dark brown. These features are characteristic of aggregates of polyalkylthiophenes (PATs) that are formed upon the addition of a "poor" or "bad" solvent (e.g., methanol or hexane) to solutions of the polymers in good solvents (e.g. $CHCl_3$). Similar features have also been noted in studies of the thermochromic transitions in solutions of P3HT in a variety of solvents. Such ultrasound induced changes have been attributed to disorder-order transformations within the individual polymer chains, with the spectral evidence consistent with the presence of both solvated (i.e., isolated) conjugated polymer and microcrystallized aggregates of the polymer. This is confirmed by dynamic light scattering experiments, which register a significant increase in the hydrodynamic radius from about 7 nm for pristine solutions to about 25 nm for solutions that have been sonicated for about one minute. The ultrasound induced spectral changes were thermally reversible, with the time taken for the restoration of the original spectral properties (as well as color of the solution) dependant on the ultrasonic irradiation time applied.

Spin coating of the polymer solutions provided thin films with the expected shift of the $\pi$-$\pi$* transition with respect to the solution state spectra, due to increased planarity of the conjugated backbone in the solid state. Unlike the spectra of the polymer solutions which have identical values of $\lambda max$ for the $\pi$-$\pi$* transition, before and after ultrasonic irradiation, the absorbance maximum in spectra of thin films obtained from ultrasonicated solutions were sequentially red-shifted as a function of solution irradiation time, relative to the film obtained from pristine solutions (e.g. $\lambda max$=about 544 nm for films from pristine solution, and about 550 nm for films obtained from solutions that had been irradiated for about 10 minutes). This suggested a further ultrasound induced planarization of the main chain. In addition, a weak peak began to develop at about 605 nm in the spectra of the thin films prepared from solutions that were irradiated for about 1 minute. This peak became more pronounced in the spectra of thin films that were prepared from solutions ultrasonicated for longer times. This fine structure can be attributed to an interchain absorption whose intensity is a measure of the degree of molecular order in the polymer film. Thus, it appeared that the increased main chain planarization led to improved cofacial $\pi$ stacking and improved order. The close correspondence between the irradiation time dependant development of vibronic structures in the solution and the solid state was clear evidence of the formation of ordered precursors in the polymer solution that were preserved through the film-formation process.

Figure 3:
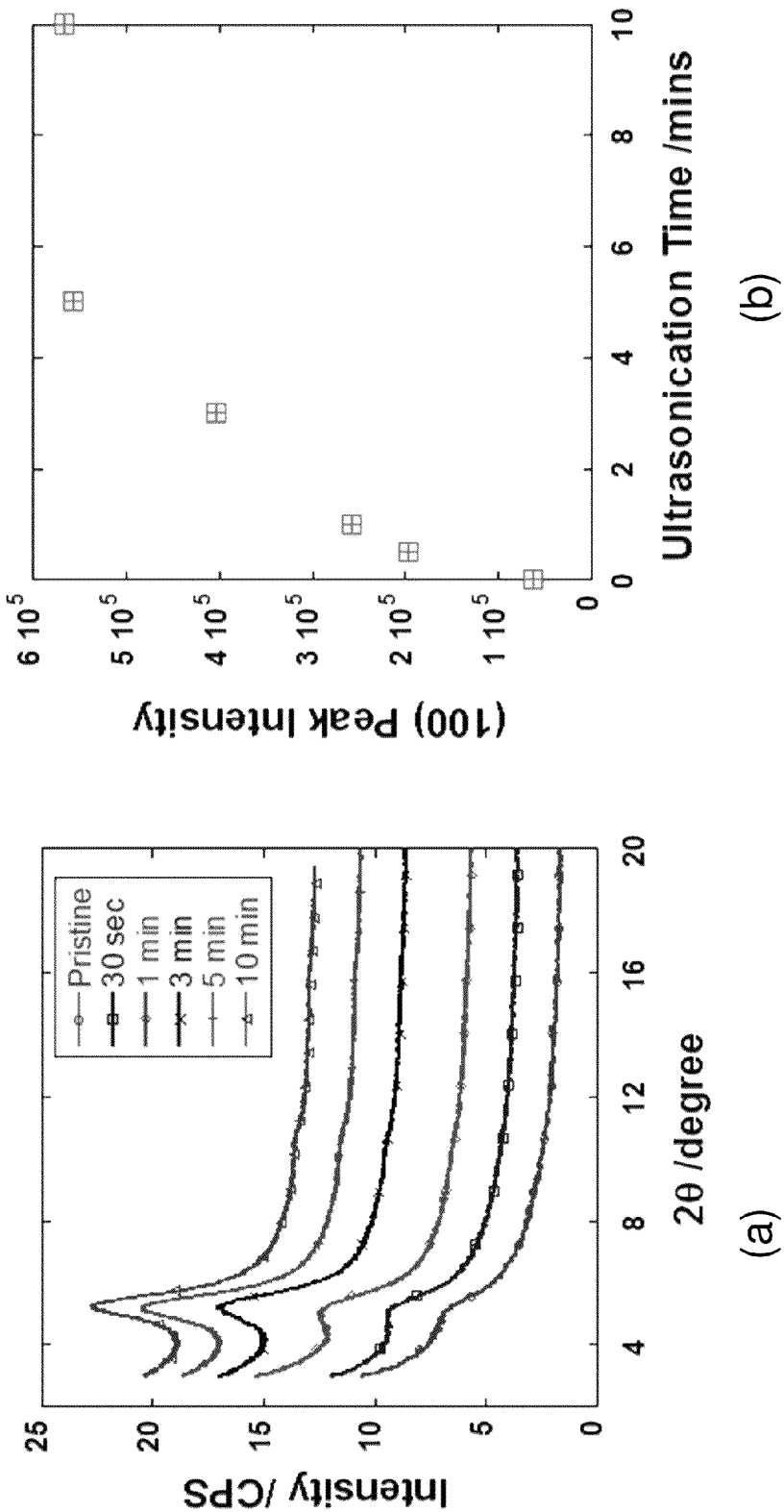
FIG. 3 graphically illustrates (a) grazing incidence X-ray diffraction patterns and (b) peak intensity of (100) reflections of films spin coated on silicon dioxide substrates from poly (3-hexylthiophene)/chloroform solutions that were sonicated for sequentially longer times.

The crystallinity and microstructure of the thin films will now be discussed. Out of plane grazing incidence X-ray diffraction (GIXD) of thin films of P3HT (FIG. 3(a)) reveal the dramatic effect of ultrasonic irradiation of solutions on the crystallinity of the films. An increase in irradiation time led to a gradual increase in the intensity of the (100) peak, associated with the lamellar packing of polymer chains along the crystallographic direction perpendicular to the backbone. This dramatic increase could be a result of either an increase in the size of individual crystallites, the number of crystallites, or both. Debye-Scherrer analysis of the peaks revealed that the coherence length corresponding to the interlayer packing along the <(100)> direction varied from about 70 to about 80 Angstroms (Å) for films obtained from pristine and irradiated solutions (about 10 minutes), respectively. This was consistent with an increase in number of crystallites with a narrow size distribution leading to an increase in the overall crystallinity of the thin film. The effect was apparent from FIG. 3(b), in which a short time irradiation of the solution (about 1 minute) led to a quadrupling of the intensity of (100) peak, with no further increase in crystallite formation beyond 5 minutes of irradiation. The microstructural change was also characterized by a simultaneous decrease in the d-spacing in the direction along the side chains, from about 17.6 Å to about 16.8 Å after about 10 minutes of irradiation, which suggests either an increase in the overlap between side chains from neighboring lamellae or a change in the side chain tilt. In agreement with the thermal reversibility of the irradiation induced changes to the UV-Vis spectra described above, thermal treatment of the ultrasonicated solutions led to a loss of crystallinity of the films.

Figure 4A:
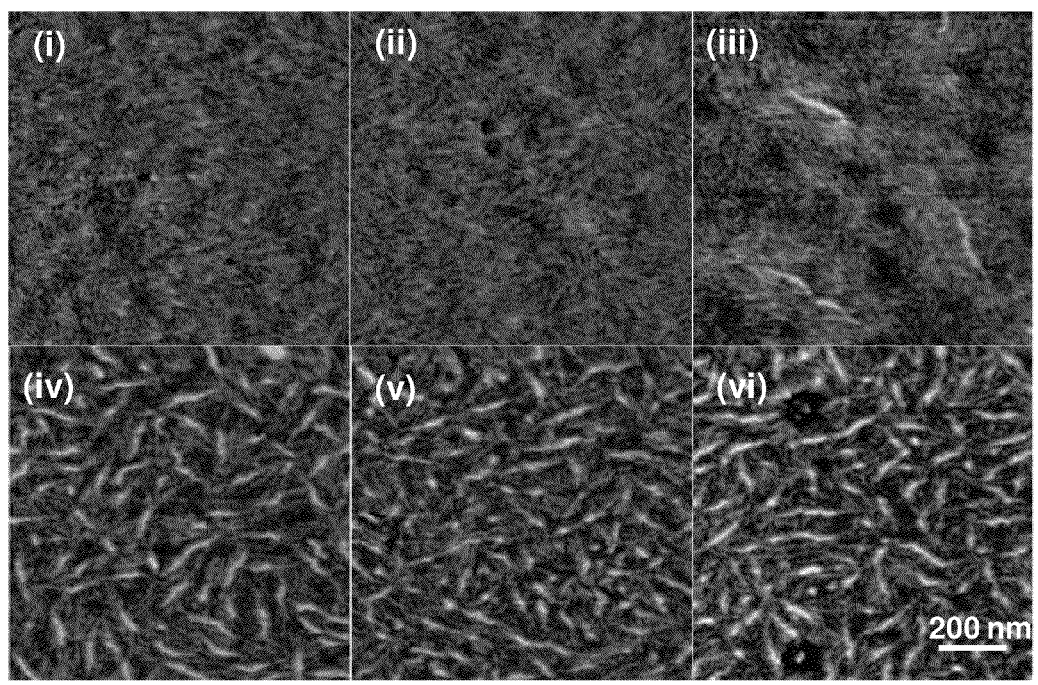
FIG. 4(a) illustrates tapping mode atomic force microscope phase images of poly(3-hexylthiophene) films obtained by spin coating from chloroform solutions which were sequentially ultrasonically irradiated for (i) about 0 seconds (ii) about 30 seconds (iii) about 1 minute (iv) about 3 minutes (v) about 5 minutes and (vi) about 10 minutes. The scan area was set to 1 micrometer (μm)×1 μm in all cases.
Figure 4B:
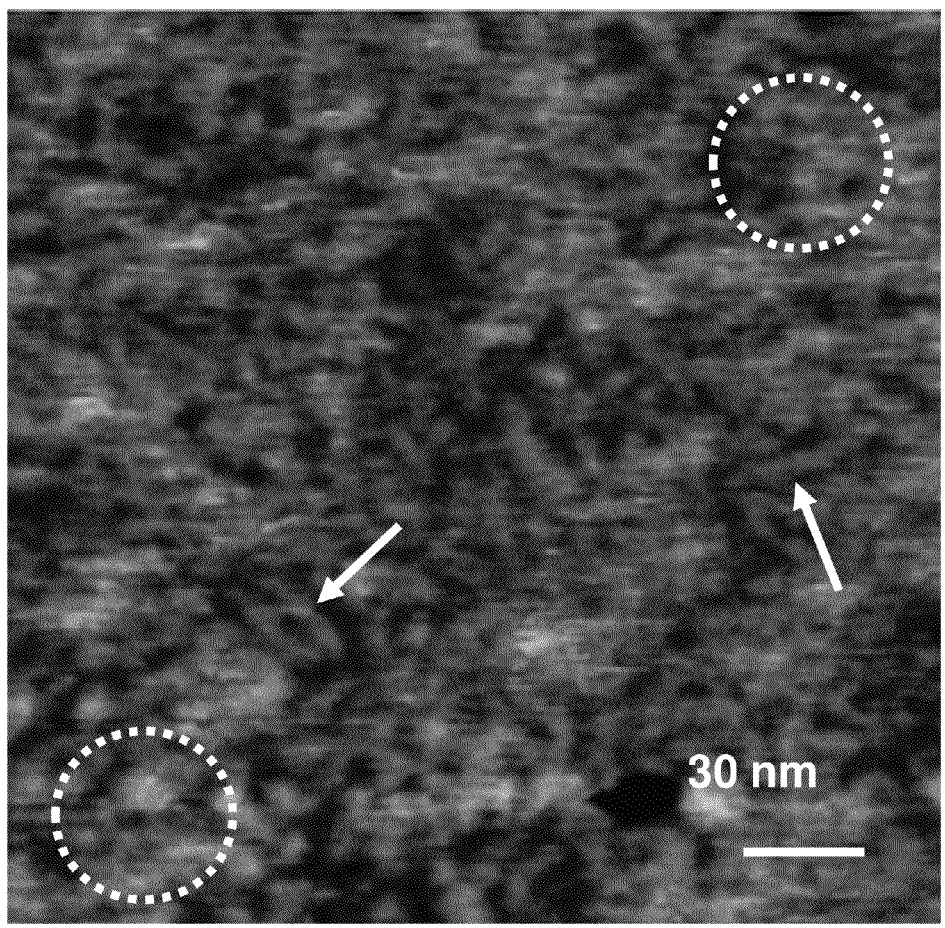
FIG. 4(b) illustrates FIG. 4(a)(i) magnified to highlight the presence of short nanofibrils and amorphous regions in the film.

AFM micrographs of P3HT films obtained from pristine and ultrasonically irradiated P3HT solutions are shown in FIG. 4(a). This demonstrates the clear evolution of a nanofibrillar morphology with increased irradiation times. In the absence of irradiation, the films showed no significant signs of mesoscale structures, consistent with reports where the short time scales during spin coating from volatile solvents hinder the formation of well ordered structures; although a closer examination revealed the presence of short nanofibrils embedded within a largely amorphous and featureless phase, as shown in FIG. 4(b). Applying a short time (about 1 minute) ultrasonic irradiation to the solutions led to the formation of more distinct nanofiber-like structures that were about 30 nm wide with lengths ranging from about 150 to about 200 nm, with the short nanofibrillar structures and amorphous regions present in all films irrespective of the ultrasonication time. Increasing the irradiation time led to an increased number of nanofibers detected within the scan area, without any substantial increase in their size. Irradiation beyond about 3 minutes led to no further significant changes. The presence of three phases in films obtained upon irradiation of at least about 1 minute must be noted, with a combination of distinct large nanofibers and smaller less distinct ones embedded within an amorphous phase. This is in agreement with the XRD results, suggesting that the increase in the degree of crystallinity of the thin films was a direct consequence of increase in microcrystallites distributed across the films. Previous work using electron diffraction and X-ray has shown that nanofibers of P3HT consist of polymer macromolecule stacks that are oriented normal to the fiber axis. Reports by others on ultrasonic irradiation of P3HT solutions have also shown the formation of nanowires, although the inventors suggest that these processes were aided by the use of relatively poor solvent systems, which were conducive to the formation of the nanofibrillar morphology even in the absence of any ultrasonic irradiation. In contrast, the methods of the present invention do not rely on the use of an additional solvent system, either pre-sonication or post-sonication, to produce the ordered assemblies.

A more detailed discussion of the results will now be provided. The demonstration of an ultrasound induced disorder-order transition in solutions of P3HT and enhanced charge transport in P3HT thin films prepared from these solutions highlighted the intricate dependence of electrical properties on microstructural changes in the solid state of these materials. The crystallinity of thin films of the polymer can be varied over a wide range by ultrasonication of the solutions. The increase in mobility is consistent with the spectroscopic evidence which suggests the presence of considerable conjugation along the polymer main chain and intramolecular and intermolecular ordering in films prepared from irradiated solutions. It is interesting to note that the ultrasound induced spectral behavior is analogous to temperature dependent studies on both solutions and films of P3HT, where an increase in temperature leads to considerable main chain disorder, as evidenced by the hypsochromic shifts in the UV absorption spectra. Although thermotropic-like transitions are observed in the solid state UV-Vis spectra, they lack a distinct isosbestic point, indicating the presence of a multiphase morphology in the films, which is confirmed by the AFM images. The increasing intensity of the vibronic structure in the solution state spectra with irradiation can be ascribed to increased generation of microcrystallites. The observation of strong mesoscale features in the film, in spite of an inherent kinetically limited film formation mechanism, supports the UV-Vis data and suggests the formation of microcrystallites in solution.

The low mobility in pristine films is in agreement with the low crystallinity of the film, which is confirmed by the relatively featureless morphology detected by the AFM. The (100) peak intensity in the X-ray diffractogram almost quadruples after about one minute of ultrasonic irradiation, with the mobility sharply increasing by two orders of magnitude within a comparable time scale. The (100) peak intensity continued to develop beyond a minute of irradiation, finally leveling off beyond 5 minutes of ultrasonication. This was strongly supported by the development of mesoscale crystallites, FIGS. 4(c-f), which clearly indicated that the number of crystallites sharply increased between about 1 and about 3 minutes of irradiation, with a relative invariance beyond about 3 to about 5 minutes. The charge transport properties were sensitive even to short irradiation times, with the mobility increasing by an order of magnitude within about 30 seconds, suggesting a rapid initial increase in the assembly of polymer chains followed by a more gradual attainment of saturation between about 1 to about 3 minutes irradiation, although the film crystallinity continued to develop beyond about 3 minutes. This was strong evidence of a percolation type transport mechanism characterized by a threshold crystallinity, with any further increase in the degree of crystallinity beyond about 3 minutes having little or no impact on the mobility of carriers, akin to a percolation threshold in carbon black/polymer systems. It is believe that the percolation pathway in the P3HT thin films was formed by regions of varying conductivity, attributed to the presence of three distinct phases, possibly varying in their crystalline order. It is suggested that ultrasonic irradiation of solutions led to a continuous transition from a disordered (for films obtained from pristine solutions) to an ordered state, with both incorporating fractions of an intermediate quasi-ordered phase. Short irradiation times led to formation of $\pi$ stacked polymer aggregates that acted as nucleation centers for nanofiber formation, with short nanofibrils constituting the quasi-ordered phase discussed above. The percolation pathway between about 1 and about 3 minutes of irradiation was established by facile charge transport through the large nanofibers (constituting the ordered phase), with the disordered and quasi-ordered phases acting as charge transport conduits between the ordered domains. Prior to percolation, the increase in mobility by an order of magnitude can be attributed to an increased fraction of the quasi ordered phase, evidenced by the three fold increase in the (100) peak intensity. It is possible that the wider and more distinct nanofibrils were polymer chains in extended conjugated states reflected in the about 6 nm bathochromic shift in the solid state absorption spectrum, while the disordered or quasi ordered phases were formed by chains with a twisted and disordered conformation, resulting in the proposed differences in conductivities between the phases. In spite of an increase in the number density of ordered domains beyond the percolation threshold (about 3 minutes), the AFM images register significant disordered and quasi-ordered regions in the film as well, which in turn are the bottlenecks for charge transport, thus accounting for only minor variations in the mobility beyond percolation. The existence of an upper limit for the mobility, about 0.03 and about 0.01 $cm^2V^{-1}s^{-1}$ (for experiments 1 and 2 respectively), in conjunction with the relative invariance of the domain size shown by AFM, may be an indication that beyond the percolation threshold, the maximum mobility was limited either by the intrinsic charge transport within the ordered domains (and thus the degree of order within the nanofibers) or by the interaction between them.

The results presented in this example establish a key relationship between the degree of crystallinity and charge transport in high MW P3HT films. Ultrasonication of solutions of conjugated polymer provided a unique and facile approach to achieve "tunable" crystallinity and allowed for the development of a more thorough understanding of structure-property correlations. Charge transport in conjugated polymer thin films was distributed between disordered, quasi-ordered and ordered phases, with the mobility being determined by a threshold crystallinity, with further generation of crystallites having minimal impact on enhancing charge transport. Identified were two distinct regions of charge transport, characterized by an initial sharp increase in the field effect mobility due to an increase in crystallinity up to the percolation limit, followed by a gradual saturation where the mobility becomes independent of the thin film microstructure.

The embodiments of the present invention are not limited to the particular formulations, process steps, and materials disclosed herein as such formulations, process steps, and materials may vary somewhat. Moreover, the terminology employed herein is used for the purpose of describing exemplary embodiments only and the terminology is not intended to be limiting since the scope of the various embodiments of the present invention will be limited only by the appended claims and equivalents thereof.

Therefore, while embodiments of this disclosure have been described in detail with particular reference to exemplary embodiments, those skilled in the art will understand that variations and modifications can be effected within the scope of the disclosure as defined in the appended claims. Accordingly, the scope of the various embodiments of the present invention should not be limited to the above-discussed embodiments, and should only be defined by the following claims and all equivalents.

What is claimed is:

1. An ordered solid polymer film comprising:
   a plurality of ordered assemblies of a conjugated polymer; and
   a carrier mobility of at least one order of magnitude greater than an unordered solid polymer film of the conjugated polymer.

2. The ordered solid polymer film of claim 1, wherein the conjugated polymer is a rigid-rod conjugated polymer.

3. The ordered solid polymer film of claim 1, wherein the conjugated polymer is selected from the group consisting of polythiophenes, polyphenylenes, and polyfluorenes.

4. The ordered solid polymer film of claim 1, wherein the conjugated polymer is a polythiophene or derivative thereof.

5. The ordered solid polymer film of claim 1, wherein the conjugated polymer is poly(3-hexylthiophene).

6. The ordered solid polymer film of claim 1, wherein the conjugated polymer has a weight average molecular weight of greater than or equal to 15 kiloDaltons.

7. The ordered solid polymer film of claim 1, wherein the conjugated polymer has a weight average molecular weight of greater than or equal to 40 kiloDaltons.

8. The ordered solid polymer film of claim 1, wherein the plurality of ordered assemblies are at least nanocrystalline in size.

9. The ordered solid polymer film of claim 1, wherein the conjugated polymer is poly(3-hexylthiophene) with a regioregularity of at least 92%.

10. A process of making the ordered solid polymer film of claim 1 comprising:
    contacting the conjugated polymer with a solvent to at least partially solvate the conjugated polymer in the solvent;
    exposing the at least partially solvated conjugated polymer and solvent to ultrasonic energy for a duration effective to form a plurality of ordered assemblies of the conjugated polymer in the solvent; and
    forming the ordered solid polymer film having the plurality of ordered assemblies of the conjugated polymer.

11. An electronic device comprising the ordered solid polymer film of claim 1.

12. The electronic device of claim 11, wherein the conjugated polymer is a rigid-rod conjugated polymer.

13. The electronic device of claim 11, wherein the conjugated polymer is selected from the group consisting of polythiophenes, polyphenylenes, and polyfluorenes.

14. The electronic device of claim 11, wherein the conjugated polymer is a polythiophene or derivative thereof.

15. The electronic device of claim 11, wherein the conjugated polymer is poly(3-hexylthiophene).

16. The electronic device of claim 11, wherein the conjugated polymer has a weight average molecular weight of greater than or equal to 15 kiloDaltons.

17. The electronic device of claim 11, wherein the conjugated polymer has a weight average molecular weight of greater than or equal to 40 kiloDaltons.

18. The electronic device of claim 11, wherein the plurality of ordered assemblies are at least nanocrystalline in size.

19. The electronic device of claim 11, wherein the conjugated polymer is poly(3-hexylthiophene) with a regioregularity of at least 92%.

20. A process of making the ordered solid polymer film of the electronic device of claim 11 comprising:
    contacting the conjugated polymer with a solvent to at least partially solvate the conjugated polymer in the solvent;
    exposing the at least partially solvated conjugated polymer and solvent to ultrasonic energy for a duration effective to form a plurality of ordered assemblies of the conjugated polymer in the solvent; and
    forming the ordered solid polymer film having the plurality of ordered assemblies of the conjugated polymer.

* * * * *